United States Patent [19]

Heller et al.

[11] 4,052,606
[45] Oct. 4, 1977

[54] CHARGE TRANSFER DEVICE TRANSVERSAL FILTERS

[75] Inventors: Lawrence Griffith Heller, Brewster; James Merrill White, Mahopac, both of N.Y.

[73] Assignee: International Business Machines Corporation, Armonk, N.Y.

[21] Appl. No.: 699,908

[22] Filed: June 25, 1976

[51] Int. Cl.² .......................... G06G 7/16; H03K 5/159
[52] U.S. Cl. ............................... 364/825; 307/221 D; 307/304; 364/572; 364/851; 364/862
[58] Field of Search ............... 235/181, 193, 194, 197; 328/160, 167; 307/221 D, 304, 229, 230

[56] References Cited

U.S. PATENT DOCUMENTS

| | | | |
|---|---|---|---|
| 3,864,558 | 2/1975 | Ka-Chung Yu | 235/193 |
| 3,906,246 | 9/1975 | Okada | 235/194 |
| 3,935,439 | 1/1976 | Buss et al. | 235/181 |
| 3,956,624 | 5/1976 | Audaire et al. | 235/194 |
| 3,987,293 | 10/1976 | Crooke et al. | 235/193 |

*Primary Examiner*—Felix D. Gruber
*Attorney, Agent, or Firm*—John J. Goodwin

[57] ABSTRACT

A charge transfer device transversal filter is provided including two equivalent charge transfer device shift registers for translating with respect to each other, a first analog signal referred to as an input signal and a second analog signal, referred to as a transfer function signal, with respect to each other. The discrete analog signals are temporarily added on field effect transistor gates. The non-linear characteristics of the field effect transistor performs multiplication. The field effect transistor currents are then summed to complete the filter convolution. The disclosed invention is implemented in either charge-coupled-device technology or bucket-brigade technology.

10 Claims, 5 Drawing Figures

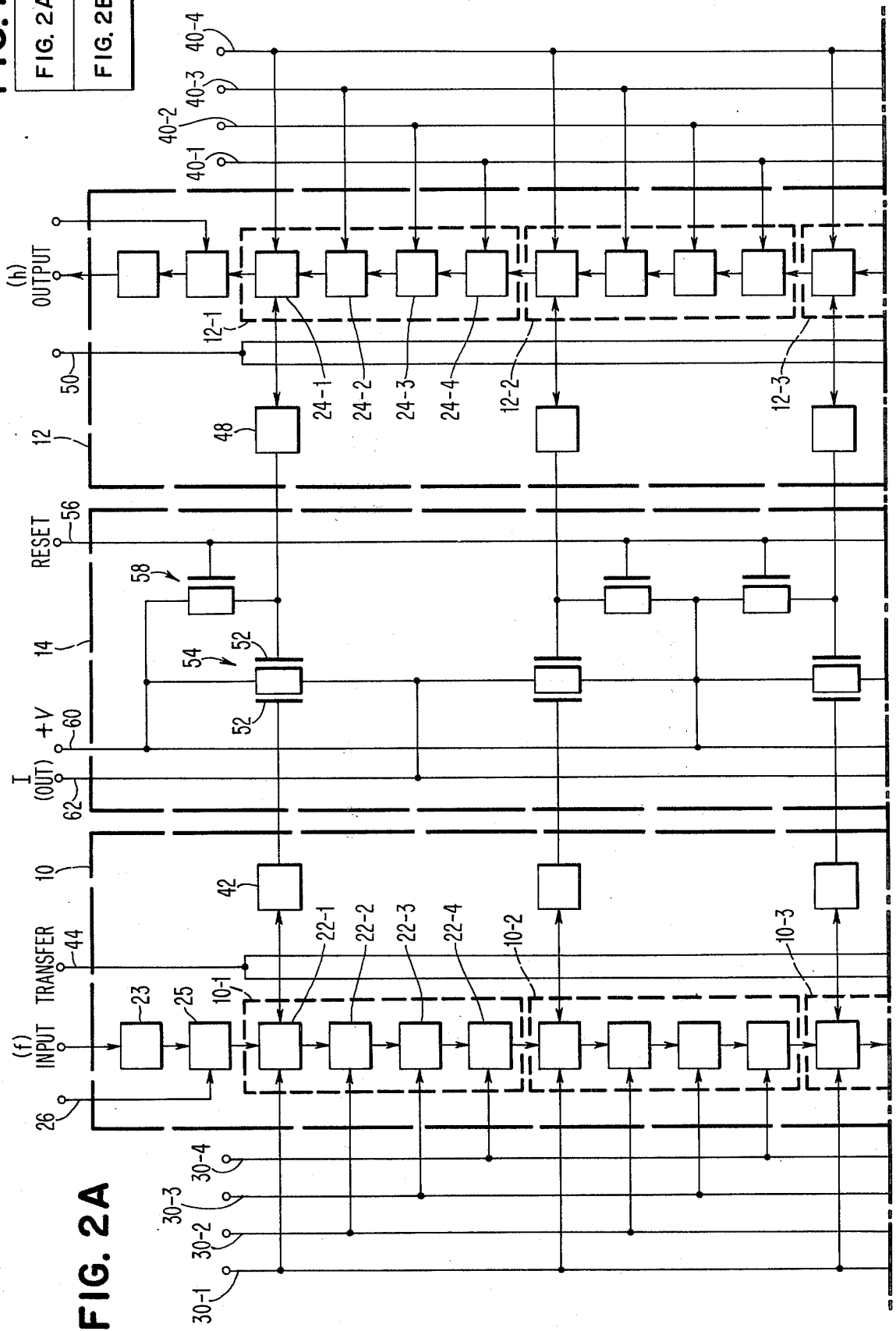

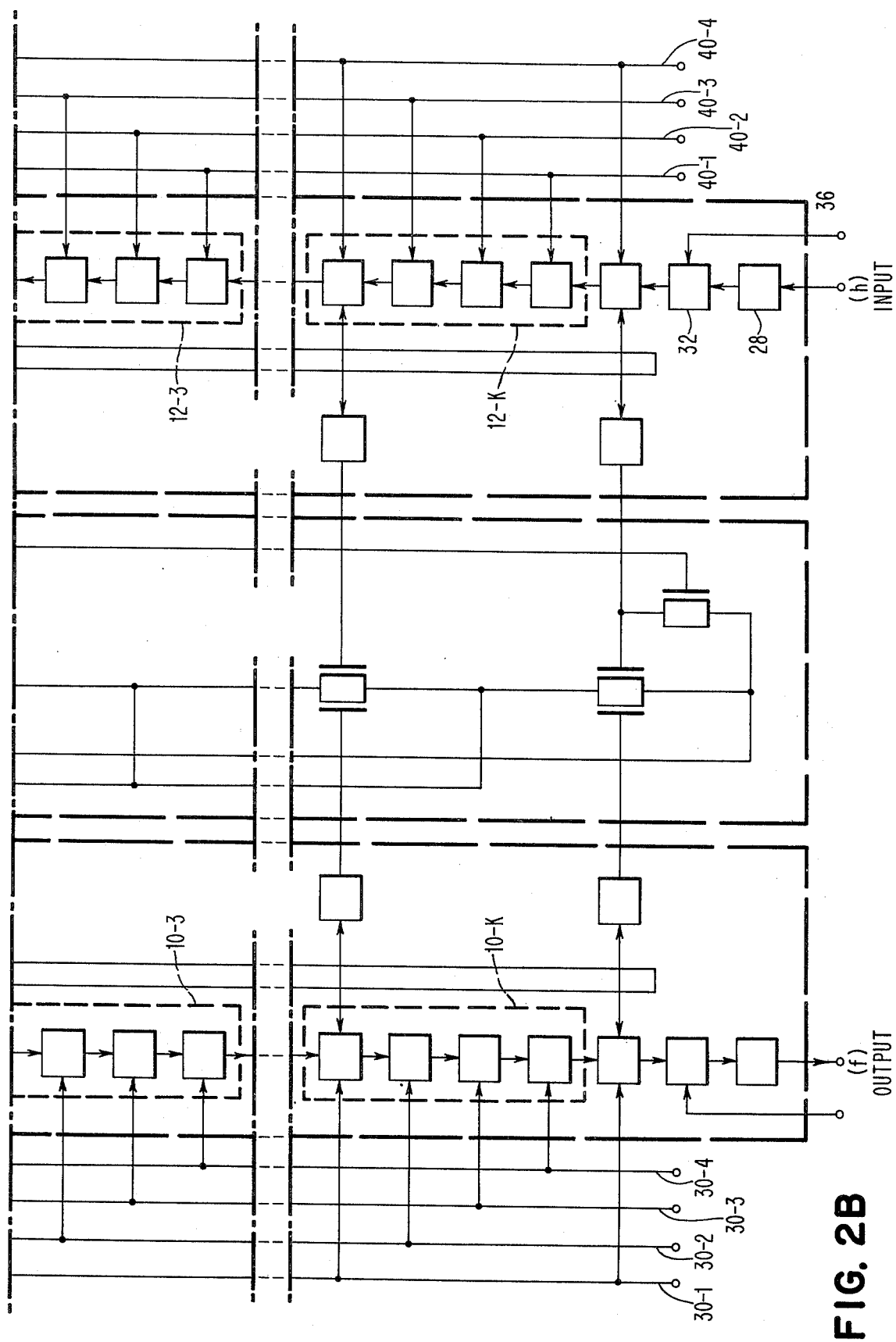

CHARGE TRANSFER DEVICE TRANSVERSAL FILTERS

BACKGROUND OF THE INVENTION

1. Field of the Invention

The present invention relates to transversal filters employing charge transfer technology, and more particularly to a programmable or adaptable charge coupled device or bucket brigade device transversal filter employing temporary charge summation on field effect transistor gates in combination with charge transfer shift registers to perform analog signal processing.

2. Description of the Prior Art

Transversal filters having adjustable weighting factors and including bucket brigade charge transfer shift registers are known. One example is described in U.S. Pat. No. 3,809,923 issued May 7, 1974 to Esser on an application filed Jan. 29, 1973 and assigned to U.S. Philips Corporation. This patent is directed to a transversal filter employing charge transfer wherein the problem of charge leakage through resistors associated with the coupled storage capacitors is avoided by charging the storage capacitors through weighted current dividers. The patent does not teach or show a transversal filter of the present invention where the charges can be replicated or temporarily added on the gates of individual FETs and also does not provide for a register system wherein the input signal and the reference signal can both be translated.

In the publication entitled "An Electrically Programmable LSI Transversal Filter for Discrete Analog Signal Processing (DASP)", by D. R. Lampe, M. H. White, J. H. Mims and J. L. Fagan, Report ECOM Contr. No. DAAB07-73-C-0337, Westinghouse Electric Corporation, Defense and Electronic Systems Center, Systems Development Division, Baltimore, Md. 21203, a combination CCD and programmable MNOS memory bank is described which performs the operations of translation, multiplication and summing to provide an adaptable transfer function device. However, the filter transfer function of this reference is not directly controlled by one of the analog signals, instead the tap values are electronically trimmed using MNOS conductances. A further distinction is that the CCD and the MNOS memory are not equivalent structures as in the present invention.

Other references of background interest are "Bucket Brigade Transversal Filters", C. M. Puckette et al., IEEE Transactions of Circuits and Systems, Vol. CAS-21, No. 4 July 1974, p. 502; "Programmable Bandpass Filter and Tone Generator Using Bucket Brigade Delay Lines ", D. A. Smith et al, IEEE Transactions on Circuits and Systems, Vol. CAS-21, No. 4 July 1974, p. 597; "Transversal Filtering Using Charge-Transfer Devices" by D. D. Buss et al., IEEE J. Solid-State Circuits, Vol. SC-8, No. 2 April 1973, p. 138; and U.S. Pat. No. 3,819,958 issued June 25, 1974 to Gosney on an application filed Nov. 3, 1972 entitled "Charge Transfer Device Analog Matched Filter" and assigned to Texas Instruments, Inc.; "Analogue Correlators Using Charge Coupled Devices", J. G. Harp et al., Int. Conf. on the Appl. of CCDs, NELC - San Diego, 1975, pp. 229-235.

SUMMARY OF THE INVENTION

An object of the present invention is to provide an improved transversal filter device including two charge coupled device structures to provide equivalent translation and real-time speed capabilities to both an input signal and transfer function registers.

Another object of the present invention is to provide an improved transversal filter device employing temporary nondestructive charge addition on FET gates to provide a nonlinear product term function.

A further object of the present invention is to provide an improved transversal filter device including an analog convolver/correlator with tap weighting controlled by a second analog signal.

Still another object of the present invention is to provide a programmable convolver/correlator using the square law characteristics of MOSFET devices in combination with CTD analog signal processing.

Another object of the present invention is to provide an improved transversal filter for use in optical character recognition, speech analyzing, seismic signal and other signal processing.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIGS. 2A and 2B when combined as shown in FIG. 2 show a schematic block diagram of an embodiment of a transversal filter according to the present invention employing charge coupled device technology.

DESCRIPTION OF THE PREFERRED EMBODIMENTS

The operation of a transversal filter can be characterized by a transfer function $h$ and the output $g$ of the filter is the convolution of the transfer function $h$ and the input function $f$ for discrete or sampled data signals as follows:

$$g(n) = \sum_{m=-\infty}^{\infty} h(m) f(n-m)$$

Three operations are included in the convolution process: translation, point-by-point multiplication, and summation or integration. In general, delay line shift registers can be used for translation, weighted taps employed for multiplication and current or charge summing for integration.

Figure 1:
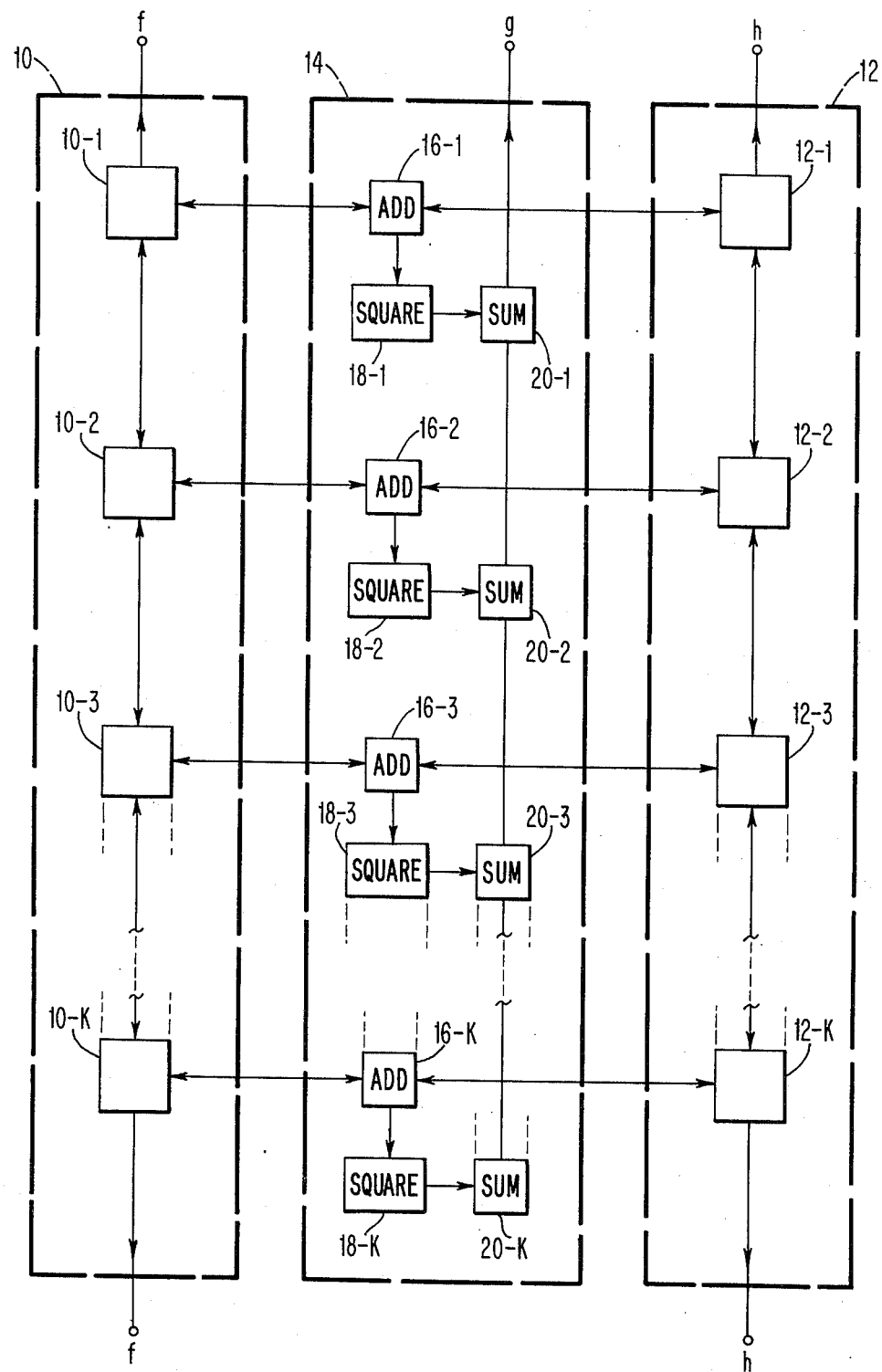
FIG. 1 is a schematic block diagram of a transversal filter device according to the principles of the present invention.
Figure 3:
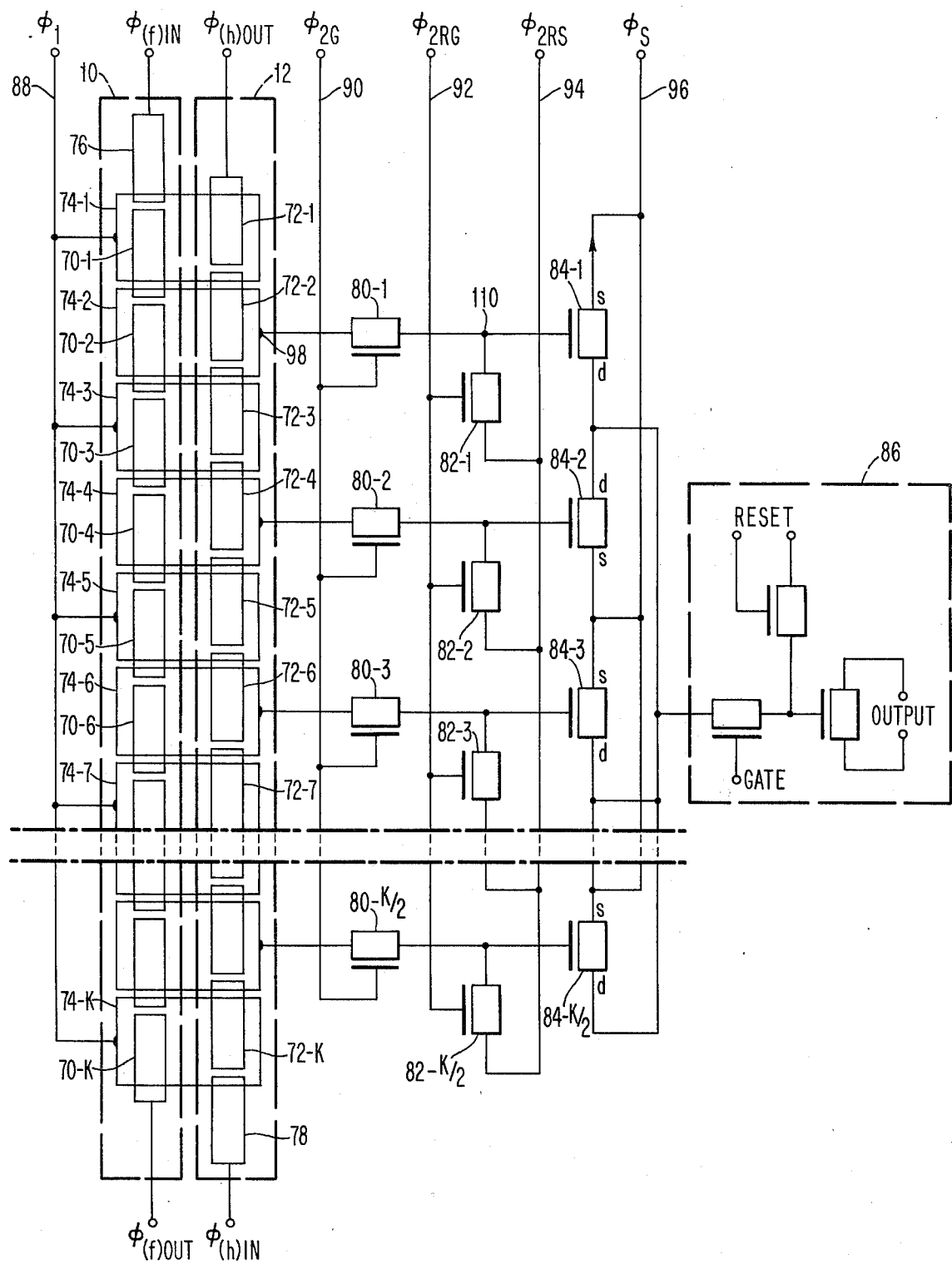
FIG. 3 is a schematic block diagram of an embodiment of a transversal filter according to the present invention employing bucket brigade technology.

In FIG. 1 a schematic block diagram illustrates a transversal filter device including two charge transfer device delay lines for translation wherein either or both of the signals $(f)$ and $(h)$, referred to in the discussion as the input signals $(f)$ and transfer function signals $(h)$ can be shifted up and/or down or one held stationary while the other is shifted. This permits correlation as well as convolution to be performed. Depending on the application, a particular shift register embodiment, such as shown in FIG. 3, need not permit reversible direction of charge transfer.

Thus, in FIG. 1, charge transfer shift register delay lines 10 and 12 include stages or elements 10-1, 10-2, 10-3 . . . 10-K and 12-1, 12-2, 12-3 . . . 12-K. The input analog signals (f) are entered into shift register 10 and the transfer function analog signals (h) are entered into shift register 12.

Shift registers 10 and 12 are by themselves conventional charge transfer devices known in the art and more detailed examples of a CCD embodiment and a bucket brigade device embodiment are set forth in FIGS. 2 and 3 and will be later described. The discrete analog samples of charge which are the (f) signals and the (h) signals may be entered at the bottom or the top of registers 10 and 12, the signals may be shifted up or down, in the same or opposite directions, or else one signal may be held stationary while the other signal is shifted up or down.

Generally, when a correlation function is desired both signals are shifted in the same relative direction and when a convolution function is desired the signals are shifted in opposite directions. In FIG. 1, it is understood that the shifting is performed by clock signals and a sequence control means which are associated with the registers but which are not shown since such implementation is within the state of the art or is set forth in FIGS. 2A and 2B and FIG. 3.

Corresponding stages or elements of the two translating shift registers are connected together in a signal processing means 14 including adding, squaring and summing means. More particularly, elements or stages 10-1 and 12-1 are connected to adding means 16-1 the output of which is connected to squaring means 18-1 which in turn is connected to summing means 20-1. Likewise, stages 10-2 and 12-2 are connected to the combination including adding means 16-2, squaring means 18-2 and summing means 20-2 and so on to stages 10-K and 12-K which are connected to the combination including adding means 16-K, squaring means 18-K and summing means 20-K.

In operation, the discrete samples of charge for the analog signals (f) and (h) are entered into registers 10 and 12, the contents of corresponding register stages (or replications thereof) are added by means 16-1, 16-2, 16-3 . . . 16-K and the resultant additions are squared by means 18-1, 18-2, 18-3 . . . 18-K. The results of the separate adding and squaring operations are then summed together to provide one term of the convolution or correlation function. A translation then takes place by either or both of shifted registers 10 and 12 shifting in the selected direction(s) and the above adding, squaring and summing functions are repeated for the new combinations in the corresponding register stages. The aforesaid operation continues until all the desired samples of the (f) and (h) signals have been processed.

Thus, at each step in the sequence, the register stages 10-1, 10-2, 10-3 . . . 10-K and 12-1, 12-2, 12-3 . . . 12-K contain packets of charge representing analog samples of the signals (f) and (H). Adding means 16-1, 16-2, 16-3 . . . 16-K and squaring means are embodied as field effect transistors (FETs). At each step, the charge in the register stages are transferred temporarily to the gate of the FET connected thereto. As an alternative, the charges in the stages can be replicated, transferred and then destroyed. In either case the charge in stages 12-1 and 10-2 are added at the gate of an FET as is the charge in stages 12-2 and 10-2 etc. The addition at the gate of each FET produces a corresponding voltage change at the gate, which was originally at threshold voltage. The voltage change can be represented as (Vg-Vth). The current through the FET is proportional to the square of this voltage change due to the characteristic of the FET. This current can be represented as follows:

$$I(m,n) = \alpha \left[ V_g(m,n) - V_{th} \right]^2 \quad (1)$$

Let $V_g(m) = h(m) + f(n-m)$, that is, the addition of the two charge packets in corresponding stages of shift registers 10 and 12. Then $$I(m,n) = h^2(m) + f^2(n-m) + V_{th}^2 - 2h(m)V_{th} - 2f(n-m)V_{th} + 2h(m)f(n-m) \quad 2$$

This is the representation of the squaring function of the FET in which the output current is proportional to the square of the difference between the gate voltage $V_g$ and the threshold voltage $V_{th}$. The currents are summed to produce an output current $$I(n) = \sum_{m=M_o}^{M_o + M} I(m,n) \quad (3)$$

where $M_o$ is an arbitrary reference point of the translation or shifting. If $h$ and $f$ are of finite length and $M$ is twice their length, then the limits of summations can be expanded to infinity and variables changed as follows:

$$I(n) = \sum_{m=-\infty}^{\infty} h^2(m) + f^2(m) + V_{th}^2 - 2h(m) + f(m) V_{th} + \sum_{m=-\infty}^{\infty} 2h(m)f(n-m) \quad (4)$$

Note that the output consists of a constant term plust the convolution:

$$I(n) = I_{constant} + \sum_{m=-\infty}^{\infty} 2h(m)f(n-m) \quad (5)$$

As $h$ and $f$ pass the ends of the finite device, the terms contributing to the first sum in (4) will fluctuate, but these changes $I(n) - I(n-1)$ will be on the order of the size of the correlation peak divided by the length of the input sequences for matched functions $f$ and $h$ so that a low pass filter and a threshold, or equivalent, will eliminate this type of fluctuation in a long, many-sample device.

FIG. 1 represents a basic functional block diagram of the invention, and can be embodied in such charge transfer technology as charge-coupled-devices and bucket brigade devices in combination with field effect transistors. FIGS. 2A and 2B illustrate a specific embodiment of the present invention in charge-coupled-device technology and FIG. 3 illustrates a specific embodiment of the same invention in bucket brigade device technology.

Referring to FIGS. 2A and 2B combined as indicated in FIG. 2 the first shift register 10, the second shift register 12 and the processing means 14 are shown including four charge-coupled device elements or electrodes in each of the stages 10-1, 10-2, 10-3 . . . 10-K and 12-1, 12-2, 12-3 . . . 12-K. The four electrodes in stage 10-1 are designated 22-1, 22-2, 22-3 and 22-4, those in stage 12-1 are designated 24-1, 24-2, 24-3 and 24-4. The other stages in registers 10 and 12 are identical to stages 10-1 and 12-1 with the exception of the charge input-/output structures at each end. 37 CCD shift registers which can be employed in the structure of FIGS. 2A and 2B are known in the art. The theory and operation of CCD structures in general are described in the book entitled "Charge Transfer Devices" by Carlo H. Sequin and Michael F. Tompsett, published by Academic Press, Inc. and copyrighted in 1975 by Bell Telephone Laboratories, Inc. (Library of Congress Catalog Card Number: (3-12814). The CCD shift registers shown in FIGS. 2A and 2B are of the four phase type, including four electrodes in each stage and being connected respectively to four shift register clock electrodes 30-1, 30-2, 30-3, 30-4 and 40-1, 40-2, 40-3, 40-4. Electrodes are employed in CCD- shift registers for forming potential wells for storing and transferring charge quantities. More particularly, a four electrode per cell CCD is described on pages 23 – 25 of the Sequin et al. book.

The specific embodiment illustrated in FIGS. 2A and 2B is arranged such that for convolution the (f) signals are entered at the top of register 10 and (h) signals are entered at the bottom of register 12. The analog charge signal (f) is entered via a diffusion 23 and is sampled and shifted into the first stage 10-1 by electrode 25 and a sampling control signal on lead 26. The same function takes place for the (h) signal which is entered via a diffusion 28 and an electrode 32 under control of the sampling signal on lead 36. After the initial period required for each register to become filled as previously discussed relative to fluctuating terms, the circuit of FIGS. 2A and 2B carry out the desired convolution of expression [5].

The signal processing will be described relative to stages 10-1 and 12-1, it being understood that similar processing takes place between the other corresponding stages. The charge sample at electrode 22-1 of stage 10-1 is transferred to electrode 42 under the control of a clock pulse on lead 44. Likewise the charge sample at electrode 24-1 of stage 12-1 is transferred to electrode 48 under the control of a clock pulse on lead 50.

This voltage change results in a change in the current through the FET, i.e. the current from lead 60 through the source-drain elements of FET 54, and this current change, because of typical FET characteristics, is proportional to the square of the change in the voltage change. This is the $[V_g(m,n) - V_{th}]^2$ term previously discussed relative to FIG. 1. Finally, the currents from each of the FETs similar to 54 associated with the other stages are combined on output lead 62 to provide an output current which satisfies or represents one term of the expressions [4] and [5] set forth hereinabove.

Further clock signals occur on leads 30-1 through 30-4 and 40-1 through 40-4 to shift the charge packets to the next succeeding register stages and a further adding, squaring and current summation occurs. This results in the production of another term for the expressions [4] and [5]. The sequence continues in this manner for the desired lengths of the (f) and (h) analog signals.

Furthermore, the filter characteristic (h) can be modified or updated by clocking in a correction or error difference term through register 12 and adding the correction values to the charge packets under electrodes 48 and all corresponding electrodes using transfer lead 50. Similarly, incremental changes can be made in the input signal (f) using the transfer lead 44 and associated electrodes 42 and so on.

A phase or clock signal on lead 56 and a voltage level on lead 60 cause FET 58 (and all other corresponding FETs) to set the gate electrode 52 of FET 54 (and all corresponding gates) to a threshold level on FET 54 (and all corresponding gates). Although shown twice for clarity, gate electrode 52 of FET 54 is a single common gate. The image charge at electrodes 42 and 48 add to control the voltage on gate electrode 52 of FET 54 although the charge packets from the shift registers, now located beneath electrodes 42 and 48, are not combined physically. After the gate electrode voltage on 52 of FET 54 has been set, and the gate isolated by FET 58, the charges are clocked from beneath 42 and 48 back into their respective shift registers 10 and 12. The voltage change produced on the gate electrode 52 of FET 54 by this removal of charge is proportional to the sum of the two charge packets and this change in gate voltage is the $V_g(m,n) - V_{th}$ term previously discussed relative to FIG. 1.

The previous discussion described one embodiment of the present invention employing charge coupled device technology. In FIG. 3 a specific embodiment of the present invention is illustrated employing bucket brigade device technology.

Referring to FIG. 3, the bucket brigade device embodiment includes shift registers 10 and 12. Shift registers 10 and 12 are composed of a plurality of separate diffusions 70-1 through 70-K and 72-1 through 72-K, with stages of each register being defined by common electrodes 74-1 through 74-K. The use of a common electrode overlay is a known bucket brigade device technique which simplifies clocking. The (f) signals are entered into register 10 via diffusion 76 and the (h) signals are entered into register (h) via diffusion 78. The signals are clocked in as analog charge samples in a conventional manner known to those skilled in the art of bucket brigade devices.

The FETs 80-1 through 80-K/2 are charge replicator elements, and the FETs 82-1 through 82-K/2 are used to establish proper gate voltages for the FETs 84-1 through 84-K/2 which operate in the square law device mode. FETs 84-1 through 84-K/2 are connected with their drain and source electrodes oriented as indicated in FIG. 3. Circuit 86 is a current integrator which assists in the current adding function to be later described.

The operation of the device of FIG. 3 will be described for one cycle or shift, for example, for charge samples on diffusions 70-2 and 72-2, it being understood that the other stages in the device operate in the same fashion. The operation is described in accordance with a time sequence $t1$, $t2$, $t3$, $t4$, $t5$, $t6$ and $t7$.

At time $t1$ the phase 1 line 88 line is low, the phase 2G line 90 is high, the phase 2RG line 92 is high and the phase 2RS line 94 is low. The phase S line is always at a d.c. level. This established a condition wherein FETs 80-1 and 82-1 conduct, which causes node 98 at electrode 74-1 to be pulled below $V_g$-$V_{th}$ where $V_g$ is the amplitude of the phase 2G pulse and $V_{th}$ is the threshold of FET 80-1. At time $t2$ the signal on the phase 1 line 88 goes momentarily high and then back to low which shifts charge onto diffusions 70-3 and 72-1. At $t3$ phase 1 line 88 stays low, phase 2G line 90 goes low, phase 2RG line 92 stays high and phase 2RS line 94 stays low. At time $t4$ the only change is that the phase 2RS line 94 goes high which causes node 110 to go high. At time $t5$ the only change is that the phase 2RG line 92 goes low and at time t6 phase 2G line 90 goes high, a displacement current integration is produced through FET 80-1 which results in a replication of the charge transfer on to diffusions 70-2 and 72-2. The replicated charge, appears at node 110 on top of a signal independent bias. The replicated charge at node 110 causes a proportional voltage change on the gate of FET 84-1, which, because it operates in the square law region, provides a current through its source and drain electrodes which is proportional to the square of the addition of the charge on diffusions 70-2 and 72-2 (i.e. the replicated charge). The current through FET 84-1 as well as the current through FETs 84-2, 84-3 etc. are summed by being applied to a conventional state of the art current integration device.

From the above description it is seen that the analog signal samples (f) and (h) have been translated by registers 10 and 12, added and squared by the FETs, and summed by the current integrator device 86 to satisfy the desired conditions of expressions (4) and (5).

What has been described, therefore, is a charge transfer device transversal filter structure which employs shift registers for signal translations of two input signal samples in combinations of two relative directions, the use of charge summation in combination with square law devices to provide addition, and finally means for summing the processed signals to provide a convolution or correlation of the two input signals. The invention has been shown in specific embodiments of charge coupled device and bucket brigade device technology, however the invention is not limited to the particular structures illustrated. The invention also used the concept of charge replication to provide speed and efficiency.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A charge transfer device transversal filter structure comprising a first charge transfer shift register responsive to a first sampled analog signal,
a second charge transfer shift register responsive to a second sampled analog signal,
said first and second shift registers including
a plurality of stages through which said sampled analog signals are discretely shifted to provide relative translation between said first and second sampled analog signals,
a plurality of multiplication means connected to corresponding pairs of stages from said first and second shift registers for producing a signal proportional to the square of the additions of the discrete analog signal samples in said corresponding shift register stages for each shifting operation,
and summing means connected to said plurality of multiplication means for summing signals proportional to the squares of the additions of said discrete analog signal samples for each shifting operation to produce a resultant output signal proportional to the addition of the squares of the additions of said translated analog signal samples wherein said resultant output signal is a convolution or correlation function of said first and second analog signals.

2. A charge transfer device transversal filter structure according to claim 1 wherein said first analog signals in said first shift register and said second analog signals in said second shift register are translated in the same direction to produce a correlation function.

3. A charge transfer device transversal filter structure according to claim 1 wherein said first analog signals in said first shift register and said second analog signals in said second shift register are translated in opposite directions to produce a convolution function.

4. A charge transfer device transversal filter structure according to claim 1 wherein one of said first and second analog signals is held stationary in its associated shift register and the other one of said analog signals is shifted in its associated shift register.

5. A charge transfer device transversal filter structure according to claim 1 wherein said first and second charge transfer shift registers are charge-coupled device register structures each including a semiconductor substrate and plurality of electrodes for forming potential wells for storing and transferring said analog signal samples.

6. A charge transfer device transversal filter structure according to claim 5 wherein each of said plurality of multiplication means includes a field effect transistor having gate, source and drain electrodes,
means connected between said gate electrode of said field effect transistor and said corresponding pair of shift register stages for coupling said discrete analog signal samples in said stages to said gate electrode to produce a potential on said gate electrode proportional to the addition of said analog signal samples
means for creating a current through said source and drain electrodes of said field effect transistor to produce a resultant current proportional to the square of the addition of said pair of analog signal samples,
and means for summing said resultant currents from each of said field effect transistors to produce said output signal.

7. A charge transfer device transversal filter according to claim 6 wherein said means connected between said gate electrode of said field effect transistor and said corresponding pair of shift register stages includes a first charge transfer transistor connected between said gate and one of said shift register stages and a second charge transfer transistor connected between said gate and the other of said shift register stages, said first and second charge transfer transistors functioning to transfer quantities of charge out of said register stages to said gate and to transfer said quantities of charges back into said register stages.

8. A charge transfer device transversal filter according to claim 7 wherein additional analog charge signals may be entered into said first and second charge-coupled device register stages when said original charge quantities in said stages are transferred to said gates, said additional analog charge signals functioning to modify and adjust said original charge quantities.

9. A charge transfer device transversal filter according to claim 1 wherein said first and second charge transfer shift registers are bucket brigade device shift register structures including a semiconductor substrate having diffusion regions and a plurality of electrodes in combination with said diffusion for storing and transferring said analog signals.

10. A charge transfer device transversal filter structure according to claim 9 wherein each of said plurality of multiplication means includes a field effect transistor having gate, source and drain electrodes
means connected between said gate electrode of said field effect transistor and said corresponding pair of shift register stages for replicating a charge quantity equal to the addition of the charge on said diffusion regions of said pair of stages, means for coupling the replicated charge quantity to said field effect transistor gate, means for creating a current through said source and drain electrodes of said field effect transistor to produce a resultant current proportional to the square of said replicated charge quantity and therefore proportional to the square of the addition of the charge on said diffusion regions of said pair of stages, and means for summing said resultant currents from each of said field effect transistors to produce said output signal.

* * * * *